(12) United States Patent
Kuroda

(10) Patent No.: US 7,637,004 B2
(45) Date of Patent: Dec. 29, 2009

(54) ELECTRONIC DEVICE MANUFACTURING METHOD AND SUPPORTER

(75) Inventor: Shingo Kuroda, Sakata (JP)

(73) Assignee: Seiko Epson Corporation (JP)

( * ) Notice: Subject to any disclaimer, the term of this patent is extended or adjusted under 35 U.S.C. 154(b) by 240 days.

(21) Appl. No.: 11/831,086

(22) Filed: Jul. 31, 2007

(65) Prior Publication Data

US 2008/0277149 A1    Nov. 13, 2008

(30) Foreign Application Priority Data

Aug. 1, 2006  (JP) ............................. 2006-210027

(51) Int. Cl.
*H05K 1/16* (2006.01)
*H05K 3/00* (2006.01)

(52) U.S. Cl. .............................. 29/743; 29/842; 29/759; 29/760; 29/832; 29/831; 269/21; 174/260; 174/254

(58) Field of Classification Search ................... 29/842, 29/832, 831, 743, 759, 760; 269/21; 174/260, 174/254
See application file for complete search history.

(56) References Cited

FOREIGN PATENT DOCUMENTS

| JP | 03-110842 | 11/1991 |
|---|---|---|
| JP | 07-211733 | 8/1995 |
| JP | 2002-313843 | 10/2002 |
| JP | 2006-086214 | 3/2006 |
| JP | 2007-123626 | 5/2007 |

*Primary Examiner*—Derris H Banks
*Assistant Examiner*—Dan D Le
(74) *Attorney, Agent, or Firm*—Harness, Dickey & Pierce, P.L.C.

(57) ABSTRACT

A method for manufacturing an electronic device includes: preparing an electronic component having an electrode; fixing the electronic component to a supporter, the supporter having a support surface and an inlet disposed in a position that is at a side of the support surface and lower than the support surface, by supporting the electronic component with the support surface so that the electronic component does not come into contact with the inlet and so that a part of a surface of the electronic component adjacent to the support surface is exposed out of the support surface and by attracting a region of the electronic component exposed out of the support surface toward the inlet; and electrically coupling the electrode and a conductive pattern with the electronic component fixed to the supporter.

5 Claims, 6 Drawing Sheets

ELECTRONIC DEVICE MANUFACTURING METHOD AND SUPPORTER

The entire disclosure of Japanese Patent Application No. 2006-210027, filed Aug. 1, 2006 is expressly incorporated by reference herein.

TECHNICAL FIELD

The present invention relates to an electronic device manufacturing method and a supporter.

RELATED ART

It is known that an electronic component is fixed using a supporter for supporting the electronic component in the process of manufacturing an electronic device. It is also known that the electronic component is fixed to the supporter by attracting the electronic component toward an inlet formed on the supporter so that the electronic component comes into intimate contact with the inlet. Further, it is known that air (compressed air) is sent from the inlet toward the electronic component to release the electronic component in intimate contact with the inlet from the supporter. See JP-A-2006-86214.

In recent years, electronic devices have been downsized and slimmed down. Accordingly, electronic components included in such electronic devices have been downsized and slimmed down as well. Downsizing and slimming down of an electronic component causes a reduction in strength of the electric component, resulting in making difficult handling of the electronic component.

SUMMARY

An advantage of the invention is to provide a method for efficiently manufacturing a reliable electronic device and a supporter that allows manufacturing of a reliable electronic device.

(1) According to a first aspect of the invention, a method for manufacturing an electronic device includes: preparing an electronic component having an electrode; fixing the electronic component to a supporter, the supporter having a support surface and an inlet disposed in a position that is at a side of the support surface and lower than the support surface, by supporting the electronic component with the support; surface so that the electronic component does not come into contact with the inlet and so that a part of a surface of the electronic component adjacent to the support surface is exposed out of the support surface and by attracting a region of the electronic component exposed out of the support surface toward the inlet; and electrically coupling the electrode and a conductive pattern with the electronic component fixed to the supporter.

In the method for manufacturing an electronic device according to the first aspect of the invention, the electronic component is fixed to the supporter by supporting the electronic component so that the electronic component does not come into contact with the inlet and by attracting the electronic component toward the inlet. In other words, according to the first aspect of the invention, the electronic component is fixed to the supporter by supporting the electronic component so that the electronic component does not come into (intimate) contact with the inlet. As a result, according to the first aspect of the invention, the electronic component is released from the state in which it is fixed to the supporter without sending air (compressed air) from the inlet toward the electronic component. In other words, the electronic component is released from the supporter without receiving a large force.

Also, in the method for manufacturing an electronic device according to the first aspect of the invention, the electronic component is attracted so as not to come into intimate contact with the inlet. As a result, the force by which the electronic component is attracted toward the inlet is prevented from becoming too large.

Thus, the first aspect of the invention allows a reduction in stress to be applied to the electronic component in the process of manufacturing an electronic device. As a result, an electronic device manufacturing method that allows manufacturing of a reliable electronic device is provided.

(2) In the method for manufacturing an electronic device according to the first aspect of the invention, a region of a surface of the electronic component opposite to a surface of the electronic component on which the electrode is formed may be supported with the support surface. The region overlaps the electrode in a plan view.

(3) In the method for manufacturing an electronic device according to the first aspect of the invention, a central region of the electronic component may be supported with the support surface. An edge region of the electronic component may be attracted toward the inlet.

(4) In the method for manufacturing an electronic device according to the first aspect of the invention, an edge region of the electronic component may be supported with the support surface. A central region of the electronic component may be attracted toward the inlet.

(5) In the method for manufacturing an electronic device according to the first aspect of the invention, the support surface may be an upper end surface of a projection. The projection may be formed so as not to surround the inlet.

(6) According to a second aspect of the invention, a supporter includes a support surface and an inlet disposed in a position that is at a side of the support surface and lower than the support surface. An electronic component is fixed to the support surface by supporting the electronic component with the support surface so that the electronic component does not come into contact with the inlet and so that a part of a surface of the electronic component adjacent to the support surface is exposed out of the support surface and by attracting a region of the electronic component exposed out of the support surface toward the inlet.

In the supporter according to the second aspect of the invention, the electronic component is fixed by supporting the electronic component so that the electronic component does not come into contact with the inlet and by attracting the electronic component toward the inlet. In other words, according to the second aspect of the invention, the electronic component is fixed so that the electronic component does not come into (intimate) contact with the inlet. As a result, according to the second aspect of the invention, the electronic component is released from the state in which it is fixed to the supporter without sending air (compressed air) from the inlet toward the electronic component. In other words, the electronic component is released from the supporter without receiving a large force.

Also, in the supporter according to the second aspect of the invention, the electronic component is attracted so that the electronic component does not come into intimate contact with the inlet. As a result, the force by which the electronic component is attracted toward the inlet is prevented from becoming too large.

Thus, the second aspect of the invention allows a reduction in stress to be applied to the electronic component in the process of manufacturing an electronic device. As a result, a supporter that allows manufacturing of a reliable electronic device is provided.

(7) In the supporter according to the second aspect of the invention, the electronic component may include an electrode. A region of a surface of the electronic component opposite to a surface of the electronic component on which the electrode is formed may be supported with the support surface. The region overlaps the electrode in a plan view.

(8) In the supporter according to the second aspect of the invention, a central region of the electronic component may be supported with the support surface. An edge region of the electronic component may be attracted toward the inlet.

(9) In the supporter according to the second aspect of the invention, an edge region of the electronic component may be supported with the support surface. A central region of the electronic component may be attracted toward the inlet.

(10) In the supporter according to the second aspect of the invention, the support surface may be an upper end surface of a projection. The projection may be formed so as not to surround the inlet.

BRIEF DESCRIPTION OF THE DRAWINGS

The invention will be described with reference to the accompanying drawings, wherein like numbers reference like elements.

DESCRIPTION OF EXEMPLARY EMBODIMENTS

Embodiments of the invention will now be described with reference to the accompanying drawings. However, the invention is not limited to those embodiments. The invention includes free combinations of the features to be described below.

First Embodiment

A method for manufacturing an electronic device according to a first embodiment of the invention will be described below with reference to FIGS. 1 to 5. FIGS. 1 to 5 are drawings showing a method for manufacturing an electronic device according to this embodiment.

The method for manufacturing an electronic device according to this embodiment includes preparing an electronic component having an electrode. This embodiment will be described using a semiconductor chip 10 as an example of the electronic component.

Figure 1:
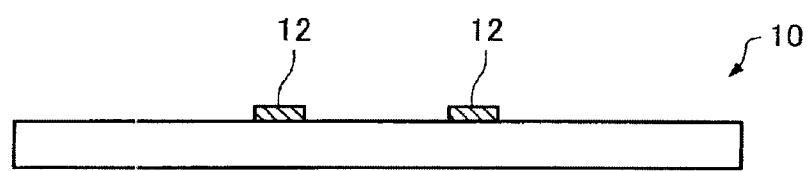
FIG. 1 is a drawing showing a method for manufacturing an electronic device according to a first embodiment.

The semiconductor chip 10 (electronic component in a broad sense) may be, for example, a silicon chip. The semiconductor chip 10 includes an integrated circuit (not shown). There is no particular limitation in the configuration of the integrated circuit. The integrated circuit may include, for example, an active element such as a transistor, or a passive element such as a resistor, a coil, or capacitor. The semiconductor chip 10 includes multiple electrodes 12. The electrodes 12 may be electrically coupled to the inside of the semiconductor chip 10. The electrodes 12 may be electrically coupled to the integrated circuit. The electrodes 12 may includes an electrode that is not electrically coupled to the integrated circuit. The electrodes 12 may be made of metal such as aluminum or copper. In this embodiment, the electrodes 12 may be disposed in the central region of the semiconductor chip 10, as shown in FIG. 1. In this case, the electrodes 12 may be formed on the integrated circuit or formed so as to avoid the integrated circuit.

Electronic components to which this embodiment is applicable are not limited to semiconductor chips. This embodiment is applicable to any electronic component (for example, piezoelectric device element) including a rigid substrate (base material).

Figure 2:
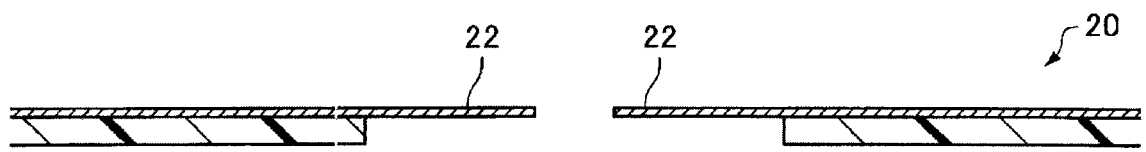
FIG. 2 is a drawing showing the method for manufacturing an electronic device according to the first embodiment.

The method for manufacturing an electronic device according to this embodiment may include preparing a wiring board 20 shown in FIG. 2. There is no particular limitation in the material or structure of the wiring board 20. Any known board may be used as the wiring board 20.

The wiring board 20 may be a flexible substrate, a rigid substrate, or a tape substrate. A flexible printed circuit (FPC), or a tape substrate for use in tape automated bonding (TAB) may be used as the wiring board 20. The wiring board 20 may be a laminar board or a single-layer one. There is no particular limitation in the shape of the wiring board 20. As shown in FIG. 2, the wiring board 20 includes a wiring pattern 22, which may be referred to as a conductive pattern. There is no particular limitation in the structure or material of the wiring pattern 22 and any known wiring may be used as the wiring pattern 22. For example, any one of copper (Cu), chrome (Cr), titanium (Ti), nickel (Ni), titanium-tungsten (Ti—W), gold (Au), aluminum (Al), nickel-vanadium (NiV), and tungsten (W) may be deposited to provide the wiring pattern 22. Alternatively, the wiring pattern 22 may be formed into a single layer made of any one of these materials. As shown in FIG. 2, the wiring board 20 may have a device hole. Alternatively, the wiring board 20 may be wiring board with no device hole (not shown).

Figure 3A:
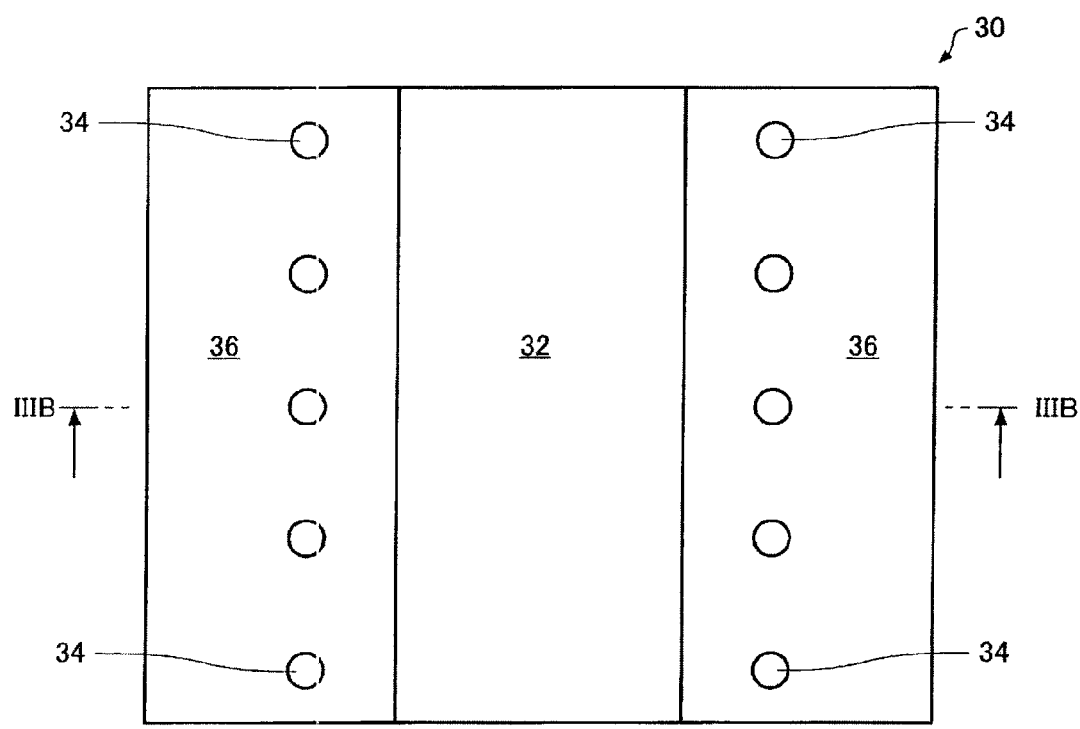
FIGS. 3A to 3C are drawings showing the method for manufacturing an electronic device according to the first embodiment.
Figure 3B:
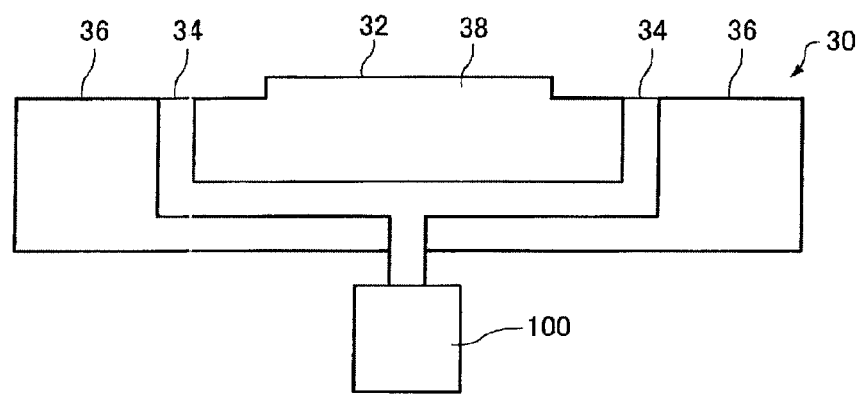
Figure 3C:
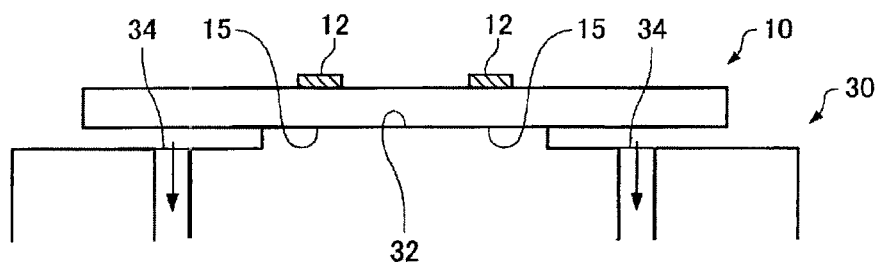

As shown FIGS. 3A to 3C, the method for manufacturing an electronic device according to this embodiment includes fixing the semiconductor chip 10 to the a supporter 30 (a support surface 32) by supporting the semiconductor chip 10 with the support surface 32 of the supporter 30 and attracting the semiconductor chip 10 toward an inlet 34. This process will be described below with reference to FIGS. 3A to 3C. FIG. 3A is plan view of the supporter 30, FIG. 3B is a sectional view taken along line IIIB-IIIB of FIG. 3A, and FIG. 3C is a drawing showing a state in which the semiconductor chip 10 is fined to the supporter 30.

First, the supporter 30 will be described with reference to FIGS. 3A and 3B.

The supporter 30 has the support surface 32, which is a surface for supporting an electronic component (semiconductor chip 10). The support surface 32 supports the semiconductor chip 10 so that the semiconductor chip 10 does not come into contact with the inlet 34 and so that a part of a surface of the semiconductor chip 10 adjacent to the support surface 32 is exposed out of the support surface 32. Specifically, the support surface 32 may support the semiconductor chip 10 so that the semiconductor chip 10 does not come into contact with the inlet 34 and so that a part of the surface of the semiconductor chip 10 adjacent to the support surface 32 does not come into contact with the support surface 32 (in other words, the support surface 32 may support the semiconductor chip 10 not by all of the surface of the semiconductor chip 10 adjacent to the support surface 32 but by only a part of the surface thereof). The support surface 32 may be disposed in a position projecting from the inlet 34. The support surface 32 may be smaller in shape than the semiconductor chip 10.

The supporter 30 has the inlet 34 for attracting the semiconductor chip 10. The inlet 34 is disposed at a side of the support surface 32 and in a position lower than the support surface 32. Specifically, the inlet 34 may be disposed in a position displaced in a direction opposite to the orientation of the support surface 32. Alternatively, the inlet 34 may be disposed so as to be oriented similarly to the support surface 32 (so as to be oriented toward the semiconductor chip 10).

As shown in FIGS. 3A and 3B, the supporter 30 may have multiple inlets 34. In this case, the multiple inlets 34 may be disposed so as to be symmetric with respect to a virtual line passing through the center of the support surface 32 in a plan view. Alternatively, the multiple inlets 34 may be disposed so as to be symmetric with respect to the center point of the support surface 32 in a plan view. The multiple inlets 34 may be arranged around the support surface 32 so as to surround the support surface 32 in a plan view. Note that the supporter 30 may have a single inlet 34.

In the supporter 30 according to this embodiment, the support surface 32 may be disposed in the central region of the supporter 30 and the inlet 34 may be disposed in the edge region of the supporter 30 in a plan view. In other words, the inlet 34 may be disposed in a region outside the support surface 32 in a plan view. The supporter 30 allows fixing of the semiconductor chip 10 by supporting the central region of the semiconductor chip 10 with the support surface 32 and attracting the edge region if the semiconductor chip 10 toward the inlet 34.

As shown in FIGS. 3A and 3B, the supporter 30 may have a base surface 36 disposed in a position lower than the support surface 32. The base surface 36 may be a surface that is oriented similarly to the support surface 32. The base surface 36 may be disposed outside the support surface 32. The inlet 34 may be an opening that is formed on the base surface 36. Incidentally, the support surface 32 projects from the base surface 36. In other words, the support surface 32 may be the upper end surface of a projection 38 that projects from the base surface 36. The projection 38 (side surface of the projection 38) is formed so as not to surround the inlet 34. In other words, the support surface 32 may be formed so as not to surround the inlet 34 in a plan view.

In this embodiment, the semiconductor chip 10 is fixed to the supporter 30 by supporting the semiconductor chip 10 with the support surface 32 and attracting the semiconductor chip 10 toward the inlet 34, as shown in FIG. 3C.

In this embodiment, the supporter 30 (support surface 32) supports the semiconductor chip 10 so that the semiconductor chip 10 does not come into contact with the inlet 34 and so that a part of the surface of the semiconductor chip 10 adjacent to the support surface 32 is exposed out of the support surface 32. Specifically, the support surface 32 may support the semiconductor chip 10 so that the semiconductor chip 10 does not come into contact with the inlet 34 and so that a part of the surface of the semiconductor chip 10 adjacent to the support surface 32 does not come into contact with the support surface 32 (in other words, the support surface 32 may support the semiconductor chip 10 not by all of the surface of the semiconductor chip 10 adjacent to the support surface 32 but by only a part of the surface thereof). The supporter 30 may support (dispose) the semiconductor chip 10 so that a part of the semiconductor chip 10 (surface of the semiconductor chip 10 adjacent to the support surface 32) faces the inlet 34. The semiconductor chip 10 may be disposed so that the inlet 34 is not exposed out of the semiconductor chip 10 in a plan view. Alternatively, the semiconductor chip 10 may be disposed so that a part of the inlet 34 is exposed out of the semiconductor chip 10 in a plan view. A region 15 that lies in a surface of the semiconductor chip 10 opposite to a surface thereof on which the electrode 12 is formed and that overlaps the electrode 12 in a plan view may be supported with the support surface 32.

In this embodiment, a region of the semiconductor chip (for example, the surface of the semiconductor chip adjacent to the support surface 32) exposed out of the support surface 32 is attracted toward the inlet 34. For example, air may be sucked into the inlet 34 using an air suction unit 100 (e.g., vacuum pump) to bring the space between the semiconductor chip (its region exposed out of the support surface 32) and the inlet 34 into a low pressure (reduced pressure) state to attract the semiconductor chip, thereby fixing the semiconductor chip to the supporter 30.

Figure 4A:
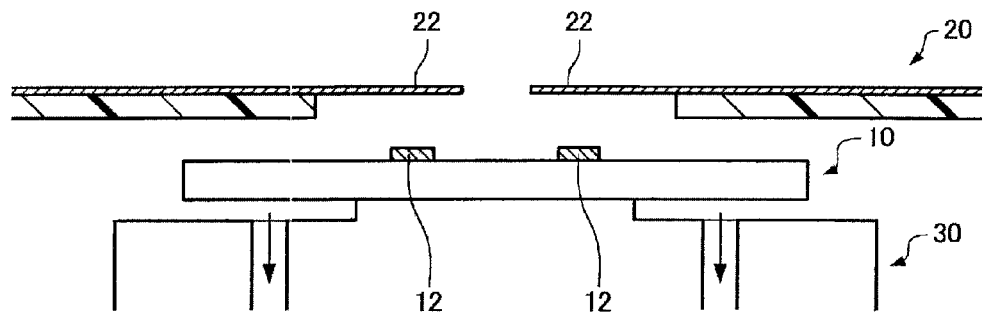
FIGS. 4A and 4B are drawings showing the method for manufacturing an electronic device according to the first embodiment.
Figure 4B:
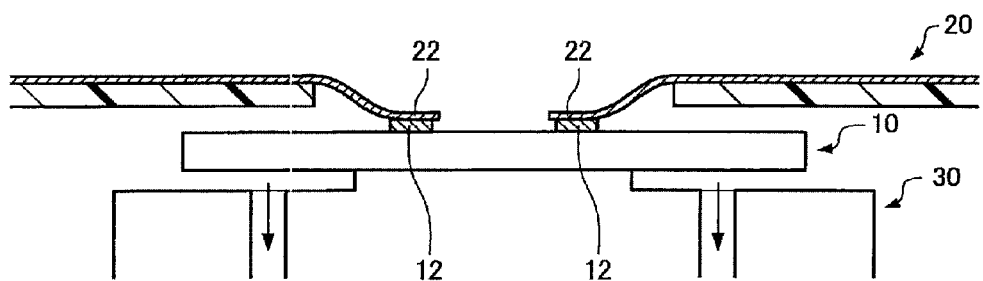

As shown in FIGS. 4A and 4B, the method for manufacturing an electronic device according to this embodiment includes electrically coupling the electrode 12 and wiring pattern 22 with the semiconductor chip (electronic component) fixed to the supporter 30. In this process, as shown in FIG. 4A, the semiconductor chip 10 and the wiring board 20 are aligned so that the electrode 12 of the semiconductor chip 10 and the wiring pattern 22 of the wiring board 20 face each other. Then, as shown in FIG. 4B, the semiconductor chip 10 and the wiring board 20 may be brought close to each other to bring the electrode 12 and the wiring pattern 22 into contact with each other, thereby electrically coupling the electrode 12 and the wiring pattern 22. In this case, the electrode 12 and the wiring pattern 22 may be coupled electrically and physically by bringing them into contact with each other and then applying heat, pressure, and ultrasonic vibration to them as necessary. Supporting the region 15 of the semiconductor chip 10 that overlaps the electrode 12 in a plan view with the support surface 32 allows the electrode 12 and the wiring pattern 22 to be pressed against each other. This allows a reliable electronic device to be manufactured.

Figure 5:
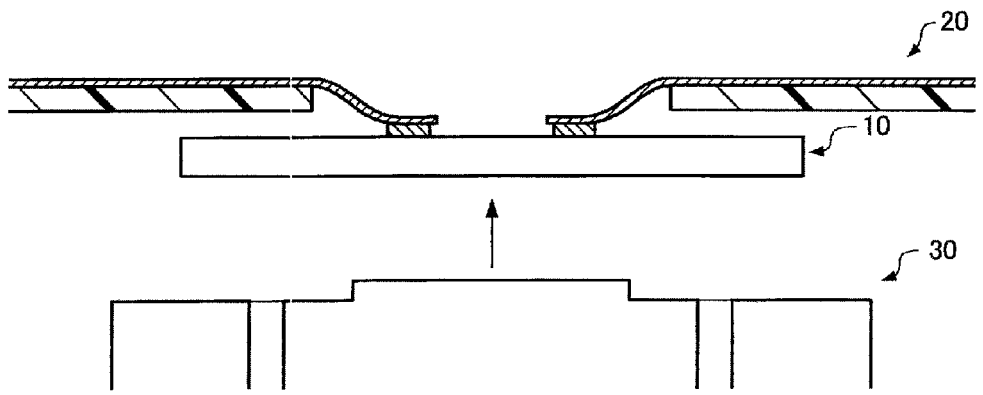
FIG. 5 is a drawing showing the method for manufacturing an electronic device according to the first embodiment.

The method for manufacturing an electronic device according to this embodiment includes stopping the suction operation of the inlet 34 (operation of the air suction unit 10) to release the space between the semiconductor chip 10 and the inlet 34 from the low pressure (reduced pressure) state to release the semiconductor chip 10 from the supporter 30, as shown in FIG. 5. In this embodiment, the semiconductor chip 10 may be released from the state in which it is fixed to the supporter 30 by stopping the operation of the air suction unit 100 without emitting (sending) air from the inlet 34 toward the semiconductor chip 10. Then, the semiconductor chip 10 may be transferred to undergo the inspection and forming processes, thereby manufacturing an electronic device (semiconductor device).

According to this electronic device manufacturing method, a reliable electronic device is efficiently manufactured. The advantages of the method will be described below.

As described above, in the method for manufacturing an electronic device according to this embodiment, the semiconductor chip 10 is fixed to the supporter 30 (support surface 32) by supporting the semiconductor chip 10 with the support surface 32 so that the semiconductor chip 10 does not come into contact with the inlet 34, and attracting the semiconductor chip 10 toward the inlet 34. That is, in the method for manufacturing an electronic device according to this embodiment, the semiconductor chip 10 is fixed to the supporter 30 so as not to block the inlet 34 with the semiconductor chip 10. In other words, in the method for manufacturing an electronic device according to this embodiment, the semiconductor chip 10 is fixed to the supporter 30 so that the semiconductor chip 10 does not come into intimate contact with the inlet 34 (supporter 30).

As a result, according to this electronic device manufacturing method, the semiconductor chip 10 is released from the state in which it is fixed to the supporter 30 only by stopping the operation of the air suction unit 100 (or only by reducing the suction pressure of the air suction unit 100) without issuing air (compressed air) from the inlet 34 toward the semiconductor chip 10. This prevents occurrence of an abrupt change in pressure in the proximity of the semiconductor chip 10 (inlet 34) when it is released from its fixed state, thereby preventing the semiconductor chip 10 from receiving an external force. Thus, according to this method (or if the supporter 30 is used), an electronic device is manufactured without breaking the semiconductor chip 10 even if the semiconductor chip 10 has low strength.

Also, in the method for manufacturing an electronic device according to this embodiment, the semiconductor chip 10 is fixed to the supporter 30 without blocking the inlet 34 with the semiconductor chip 10. This prevents the semiconductor chip 10 from receiving a large attraction force. As a result, the semiconductor chip 10 is easily and reliably prevented from receiving too large a pressure. This allows manufacturing of an electronic device without breaking the semiconductor chip 10.

Further, the method for manufacturing an electronic device according to this embodiment allows the support surface 32 of the supporter 30 to be reduced in size. This makes lower the possibility that a foreign object may adhere to the support surface 32, thereby allowing a reliable electronic device to be manufactured.

Figure 6:
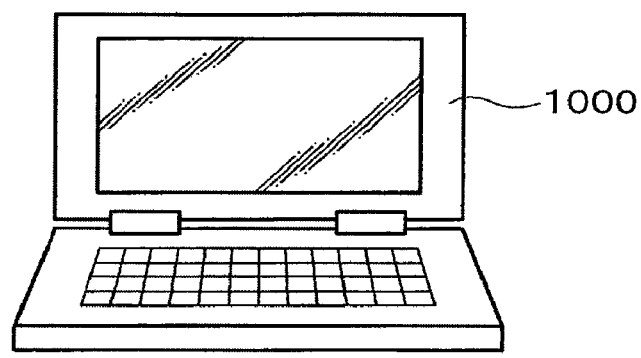
FIG. 6 is a drawing showing the method for manufacturing an electronic device according to the first embodiment.
Figure 7:
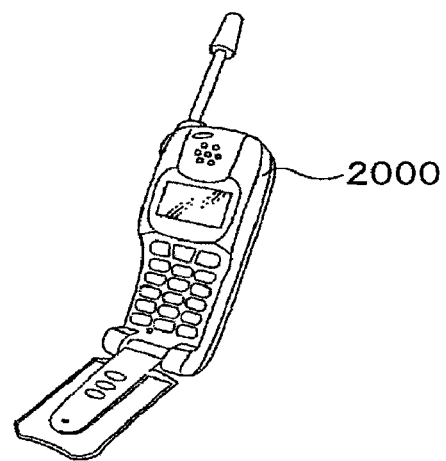
FIG. 7 is a drawing showing the method for manufacturing an electronic device according to the first embodiment.

As examples of electronic apparatuses manufactured using this method, a notebook personal computer 1000 is shown in FIG. 6 and a cellular phone is shown in FIG. 7.

Second Embodiment

A method for manufacturing an electronic device according to a second embodiment will now be described with reference to the drawings.

Figure 8:
FIG. 8 is a drawing showing a method for manufacturing an electronic device according to a second embodiment.
Figure 9A:
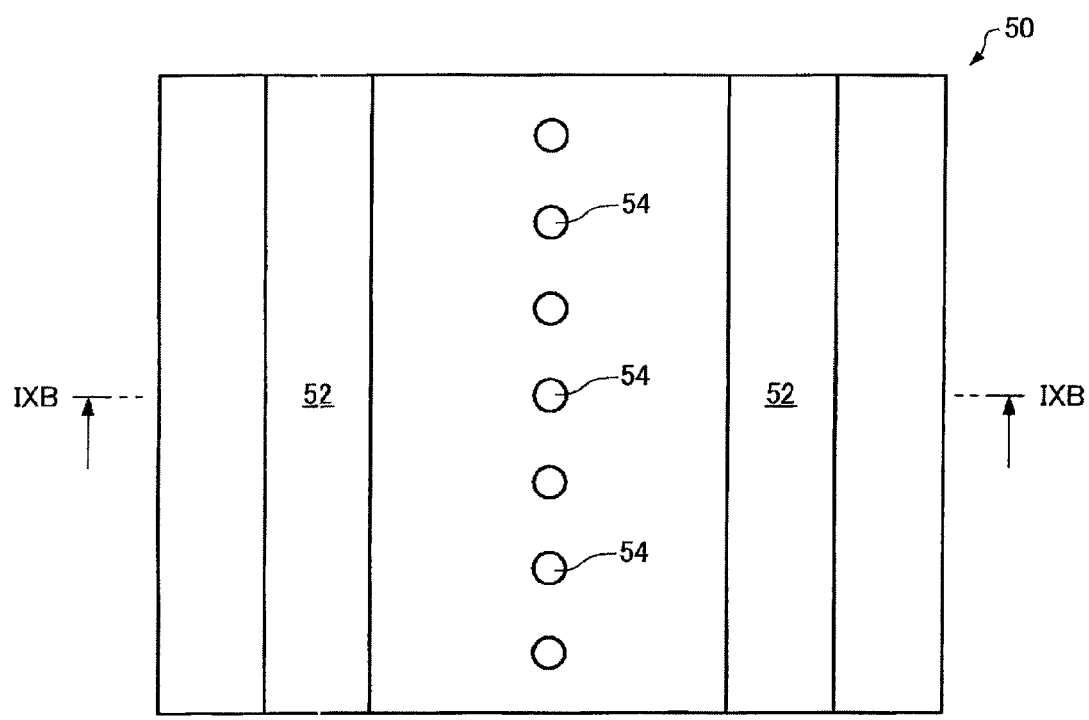
FIGS. 9A to 9C are drawings showing the method for manufacturing an electronic device according to the second embodiment.
Figure 9B:
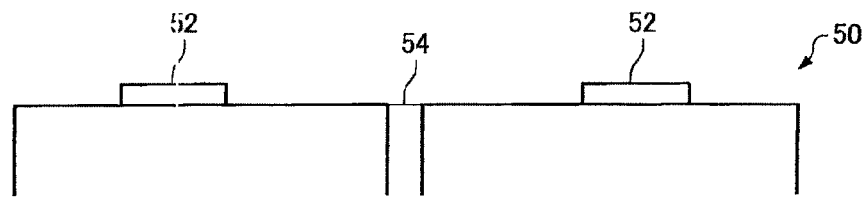
Figure 9C:
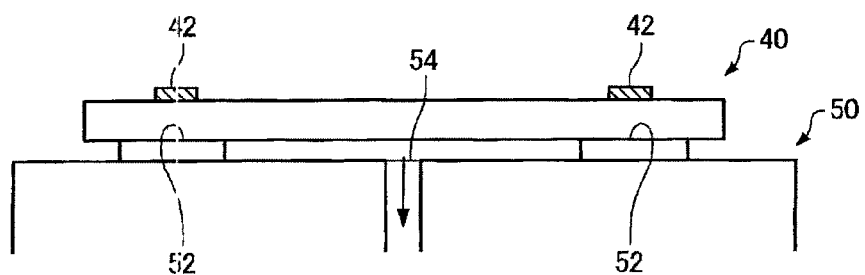

The method for manufacturing an electronic device according to this embodiment includes preparing an electronic component 40 shown in FIG. 8. The electronic component has multiple electrodes 42. The multiple electrodes 42 may be disposed (only) in edge regions of the electronic component, as shown in FIG. 8.

The method for manufacturing an electronic device according to this embodiment includes fixing the electronic device 40 to a supporter 50 by supporting the electronic component 40 with the supporter 50. In this case, the supporter 50 has a support surface 52 for supporting the electronic component 40 and an inlet 54 disposed in a position that is at a side of the support surface 52 and lower than the support surface 52. In this embodiment, the support surface 52 is disposed in an edge region of the supporter 50 and the inlet 54 is disposed in the central region of the supporter 50. The support surface 52 is formed so as not to surround the inlet 54 in a plan view. In this embodiment, the electronic component 40 is fixed to the supporter 50 by supporting the edge region (region in which the electrode 42 is formed) of the electronic component 40 with the support surface 52 and attracting the central region of the electronic component 40 toward the inlet 54.

Figure 10:
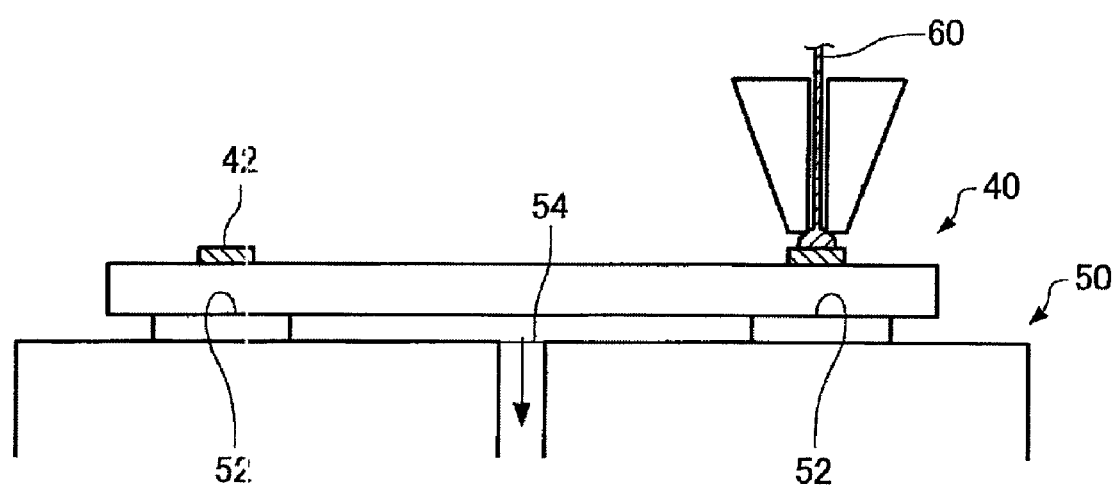
FIG. 10 is a drawing showing the method for manufacturing an electronic device according to the second embodiment.

As shown in FIG. 10, the method for manufacturing an electronic device according to this embodiment includes electrically coupling the electrode 42 and a conductive pattern 60 with the electronic component 40 fixed to the supporter 50. In this embodiment, the conductive pattern 60 may be a wire, as shown in FIG. 10. Specifically, the wire bonding process is performed with the electronic component 40 fixed to the supporter 50 so as to couple the electrode 42 and the conductive pattern 60.

Then, the electronic component 40 may be released from the supporter 50 by stopping the suction operation of the air suction unit, so as to be transferred to undergo the inspection and forming processes, thereby manufacturing an electronic device.

Even if the supporter 50 is used, the electronic component 40 is fixed to the supporter 50 so that the electronic component 40 does not come into (intimate) contact with the inlet 54. As a result, advantages similar to those of the supporter 30 mentioned above are obtained, thereby allowing a reliable electronic device to be manufactured.

The invention is not limited to the embodiments described above and various modifications can be made to those embodiments. For example, the invention includes features substantially similar to those described in the embodiments (for example, features similar in function, method, and outcome, or features similar in objective and advantage). The invention also includes features in which not substantial ones of the features described in the embodiments are replaced with others. Further, the invention includes features that have the operation and effect similar to the features described in the embodiments or features that allow attainment of objectives similar to those of the features described in the embodiments. Furthermore, the invention includes features that include a known technology in addition to the features described in the embodiments.

What is claimed is:

1. A method for manufacturing an electronic device, comprising:

preparing an electronic component having an electrode;

fixing the electronic component to a supporter, the supporter having a support surface and an inlet disposed in a position that is at a side of the support surface and lower than the support surface, by supporting the electronic component with the support surface so that the electronic component does not come into contact with the inlet and so that a part of a surface of the electronic component adjacent to the support surface is exposed out of the support surface and by attracting a region of the electronic component exposed out of the support surface toward the inlet; and electrically coupling the electrode and a conductive pattern with the electronic component fixed to the supporter.

2. The method for manufacturing an electronic device according to claim 1, wherein a region of a surface of the electronic component opposite to a surface of the electronic component on which the electrode is formed, the region overlapping the electrode in a plan view, is supported with the support surface.

3. The method for manufacturing an electronic device according to claim 1, wherein
- a central region of the electronic component is supported with the support surface, and
- an edge region of the electronic component is attracted toward the inlet.

4. The method for manufacturing an electronic device according to claim 1, wherein
- an edge region of the electronic component is supported with the support surface, and
- a central region of the electronic component is attracted toward the inlet.

5. The method for manufacturing an electronic device according to claim 1, wherein
- the support surface is an upper end surface of a projection, and
- the projection is formed so as not to surround the inlet.

* * * * *